United States Patent [19]

Tada et al.

[11] Patent Number: 4,806,436
[45] Date of Patent: Feb. 21, 1989

[54] SUBSTRATE FOR AMORPHOUS SILICON SOLAR CELLS

[75] Inventors: Kiyoshi Tada; Kenji Tsukamoto; Tatsuo Otsuka, all of Sakai, Japan

[73] Assignee: Showa Aluminum Corporation, Osaka, Japan

[21] Appl. No.: 47,559

[22] Filed: Apr. 27, 1987

Related U.S. Application Data

[63] Continuation of Ser. No. 760,379, Jul. 30, 1985, abandoned.

[30] Foreign Application Priority Data

Aug. 6, 1984 [JP] Japan ............................... 59-165534
Dec. 3, 1984 [JP] Japan ............................... 59-256301
Dec. 3, 1984 [JP] Japan ............................... 59-256302

[51] Int. Cl.$^4$ ............................................. B32B 15/04
[52] U.S. Cl. .................................. 428/629; 428/654; 428/472.2
[58] Field of Search ............... 420/627, 632; 428/654, 428/472.1; 204/58; 136/258 AM

[56] References Cited

U.S. PATENT DOCUMENTS

4,410,558 10/1983 Izu et al. ..................... 136/258 AM
4,518,815 5/1985 Yamazaki ..................... 136/258 AM

FOREIGN PATENT DOCUMENTS

3023165A1 1/1982 Fed. Rep. of Germany ...... 136/258 AM
226536 10/1925 United Kingdom .................. 204/58
631467 11/1949 United Kingdom .................. 204/58

OTHER PUBLICATIONS

Dr. Walter W. E. Hübner et al., The Practical Anodizing of Aluminum, MacDonald & Evans, London, England, 1960, pp. 44–46.
J. H. Manhart et al., "Acid Disolution Tests for Seal Quality of Anodized Aluminum", 57th Convention, American Electroplaters' Society–Canada, Jun. 22, 1970.
K. Shibuta, "Comparison of Typical Japanese Vertical and Horizontal Anodizing Lines", Light Metal Age, Feb., 1983, pp. 22, 26–29.

Primary Examiner—John J. Zimmerman
Attorney, Agent, or Firm—Armstrong, Nikaido, Marmelstein & Kubovcik

[57] ABSTRACT

A substrate for amorphous silicon solar cells comprises an aluminum or aluminum alloy plate which is formed on at least one surface thereof with an oxalic acid anodized film in an unsealed state and having a thickness of 1 to 20 μm. A plurality of amorphous silicon solar cells provided on the substrate include lower electrodes of chrominum or the like which are formed on the anodized film. The lower electrodes are electrically insulated from one another by the anodized film.

9 Claims, 1 Drawing Sheet

SUBSTRATE FOR AMORPHOUS SILICON SOLAR CELLS

This application is a continuation of application Ser. No. 760,379 filed July 30, 1985 now abandoned.

BACKGROUND OF THE INVENTION

The present invention relates to a substrate for amorphous silicon solar cells, more particularly to a substrate for forming thereon a plurality of solar cells as connected in series.

The percentages used herein and in the appended claims are by weight. The term amorphous silicon will be hereinafter abbreviated as "a-Si."

An assembly of solar cells connected in series is prepared, for example, by forming a plurality of lower electrodes of chromium or the like on a substrate by the electron beam vacuum evaporation process or the like, forming an a-Si layer on each of the lower electrodes, for example, by the chemical vapor deposition process (CVD process), covering the a-Si layer with a transparent electrically conductive film, and connecting the resulting cells in series. With such solar cell assembly, the lower electrodes must of course be electrically insulated from one another by giving an increased resistance value to the portion between the lower electrodes.

Accordingly the substrates heretofore used for solar cell assemblies of the type described include a stainless steel plate having a polyimide resin surface coating serving as an electric insulation layer, and a glass substrate. However, the former has the problem of encountering difficulty in reducing the cost of solar cells because the stainless steel plate and polyimide resin are very expensive, while the latter has the problem of being low in heat dissipating property and fragile.

SUMMARY OF THE INVENTION

The main object of the present invention is to provide a substrate for a-Si solar cells which is free of the above problems.

The present invention provides a substrate for a-Si solar cells which comprises an aluminum or aluminum alloy plate formed on at least one surface thereof with an unsealed oxalic acid anodized film having a thickness of 1 to 20 μm. The substrate is less expensive than the substrate which is obtained by coating a stainless steel plate with polyimide resin. The present substrate is superior to the glass substrate in heat dissipating property and resistance to break.

The present invention will be described in greater detail with reference to the accompanying drawings.

DESCRIPTION OF THE PREFERRED EMBODIMENTS

Figure 1:
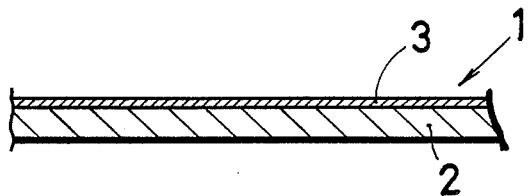
FIG. 1 is a view in section taken in the direction of thickness and showing a substrate embodying the invention for a-Si solar cells.
Figure 2:
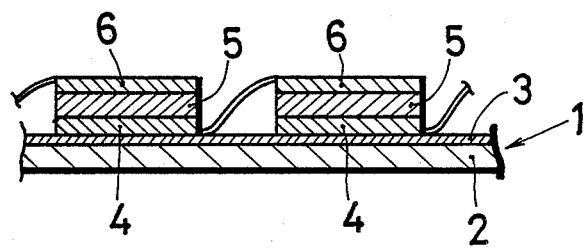
FIG. 2 is a view in section taken in the direction of thickness and showing a-Si solar cells which are connected in series and provided with the substrate.

With reference to FIG. 1, a substrate 1 embodying the present invention comprises a plate 2 which is formed on one surface thereof with an unsealed oxalic acid anodized film 3 having a thickness of 1 to 20 μm and serving as an electric insulation layer. Each of solar cells formed on the substrate 1 comprises a lower electrode 4 of chromium on the film 3, an a-Si layer 5 covering the lower electrode 4, and an upper electrode 6 formed over the a-Si layer 5 and in the form of a transparent electrically conductive film as seen in FIG. 2. All the cells are electrically connected together in series, with the upper electrode 6 of each cell connected to the lower electrode 4 of another cell immediately adjacent thereto.

The plate 2 to be used is a plate of aluminum having a purity of at least 99%, or any aluminum alloy plate. Aluminum plates and aluminum alloy plates contain impurities which inevitably become incorporated during production. Among such impurities, presence of iron and silicon which form crystals on the surface of the plate 2 poses problems to the substrate 1. When either the aluminum plate or aluminum alloy plate is used, the plate 2 should have reduced iron and silicon contents. Preferably, the combined content of iron and silicon in the plate 2 is up to about 1%. More preferably, the iron and silicon contents are up to 0.25% and 0.20%, respectively, if largest. When the plate 2 contains large amounts of iron and silicon, some of the iron and silicon crystals contained in the plate 2 are exposed at the surface of the plate 2, with the resulting likelihood that the anodized film 3 formed on the plate surface as an electric insulation layer will develop defects at the portions of the exposed crystals to impair the insulation of the film 3. Accordingly there is a need to give an increased thickness to the film 3 to completely cover the exposed crystals and prevent the impairment of the insulation. However, the increase in the thickness of the film 3 entails the following problems, so that the film thickness is preferably smaller. The substrate is heated to about 250° to about 350° C. by the process for forming the lower electrode by vacuum evaporation and also by the process for forming the a-Si layer. If the film 3 has a large thickness, the problem then arises that the film 3 develops cracks to undergo insulation breakdown, permitting short-circuiting between the lower electrode and the substrate 1. The cracking is liable to occur when the film thickness exceeds 20 μm. Further when the anodized film is formed on the surface of the plate 2 by a continuous anodizing apparatus, the anodized film 3 obtained needs to be cut to a predetermined size, but if the film 3 has a large thickness, for example, of more than 10 μm, the cutting die wears away early, hence uneconomical. Thus, it is desirable to consider this problem also when the film 3 is to be formed by the continuous process. The foregoing fact indicates that the thickness of the film 3 can be decreased when the amount of crystals on the surface of the plate 2 is minimized by reducing the iron and silicon contents of the plate 2. When the plate 2 is made of aluminum, the iron and silicon contents decrease as the purity of the aluminum increases, so that the film thickness can be made smaller. For example, satisfactory electrical insulating properties are available with a thickness of about 10 μm when the aluminum has a purity of 99.7%, or with a thickness of about 5 μm for a purity of 99.9%, or with a thickness of about 1 μm for a purity of 99.99%. It is desirable that the aluminum purity of the aluminum plate be at least 99.7%. When the purity is higher than this value, the iron and silicon contents are invariably up to 0.25% and up to 0.20%, respectively. Of the wrought materials of AA standards, it is desirable to use AA1070, AA1080, etc. AA1070 contains up to 0.25% of iron and up to 0.20% of silicon. AA1080 contains up to 0.15% of each of iron and silicon. When an aluminum plate is used as the plate 2, the strength of the plate 2 is not always as high as is required for use as the solar cell substrate. In such a case, it is desirable that before the formation of the film 3, the plate be clad with an aluminum alloy of the AA5000 type for reinforcement over the surface thereof opposite to the surface to be coated with the film 3. The aluminum alloy plate to be used as the plate 2 can be one which is composed of alloy elements other than those which will crystallize out on the surface of the plate 2, such as iron and silicon. From the elements other than those which crystallize out on the surface, the elements that will impair the corrosion resistance of the plate 2 and the amenability thereof to anodizing treatment are excluded. Typical of useful elements is, for example, magnesium. The magnesium content is preferably 3.5 to 4.5%. The aluminum alloy plate is prepared from a mixture of aluminum having a purity, for example, of at least 99% and serving as the base material, and magnesium or like alloy element. The iron and silicon contents of the aluminum alloy plate obtained are preferably lower as in the case of the pure aluminum plate described above. Accordingly, it is most desirable to use pure aluminum of at least 99.7% in purity as the base material.

The roughness of the surface of the plate 2 to be coated with the anodized film 3 is preferably up to 0.5 μm in the maximum height Rmax. of sampled portion as measured by the method of JIS B 0601-1970. The surface roughness of up to 0.5 μmin Rmax. is desirable for the plate 2 because the anodized film 3 can then be made smooth-surfaced. When the surface roughness exceeds 0.5 μm in Rmax., there is a likelihood that the surface of the film 3 will have minute irregularities. If the surface of the anodized film 3 is not smooth but has a large number of minute irregularities or a minute reticular structure, the lower electrode formed thereon will be ruptured to cause short-circuiting, rendering the solar cell obtained unable to function as such. The surface roughness is more preferably up to 0.3 μm in Rmax. A surface roughness of up to 0.5 μm in Rmax. can be realized with use of a usual rolled plate by buffing the plate first and chemically polishing the plate subsequently. Alternatively, a glossy roll-formed plate may be used which is produced using rolls of reduced surface roughness. The glossy roll-formed plate can be surfaced to a roughness of up to 0.5 μm in Rmax. as rolled without the necessity of buffing and chemical polishing. For the quantity production of substrates 1, it is desirable to use such roll-formed plate in view of the cost.

The oxalic acid anodized film 3 is free from electrolyte anions which are great in dissociation constant, is extremely small in the amount of adsorbed water and therefore has excellent electrical insulating properties and a high electric resistance value. Consequently, when the lower electrodes 4 of solar cells are formed on the film 3 of the substrate 1, the lower electrodes 4 are electrically insulated from the substrate effectively. Generally known as anodized films are, in addition to oxalic acid anodized film, sulfuric acid anodized film, phosphoric acid anodized film, chromic acid anodized film, etc. However, the sulfuric acid anodized film, which contains large amounts of sulfate anions and adsorbed water, has low insulating properties and is not suitable as an electric insulation layer for a-Si solar cell substrates. It is generally difficult to form the phosphoric acid anodized film with a large thickness because of its nature. It is therefore impossible to obtain such a thickness that the film is unlikely to undergo an insulation breakdown due to defacement or the like during handling for use as a substrate for a-Si solar cells. The electrolyte for forming the chromic acid anodized film contains poisonous chromic acid, causes pollution problems, requires equipment for treatment before disposal and renders the film costly. For these reasons, the oxalic acid anodized film is selected for the invention to serve as an electric insulation layer. The oxalic acid anodized film 3 is left in an unsealed state because we have found that the unsealed anodized film has the following two characteristics. First, the film 3 is resistant to cracking even when exposed to a high temperature. Consequently, the film 3 is prevented from developing cracks that would impair the electrical insulating properties of the film 3 even if the substrate is heated to a temperature of 250° to 350° C. during the step of forming the lower electrodes or a-Si layer. Second, the film surface does not have a minute reticular structure. If the film surface has a reticular structure, there is a likelihood that the solar cell will not exhibit the contemplated characteristics. Although it is general practice to seal anodized films after the anodizing treatment, the sealed anodized film is likely to crack during the step of forming the lower electrodes or a-Si layer to cause short-circuiting between the lower electrode and the substrate. Further because the sealed anodized film has a minute recticular surface structure, there is a likelihood that the solar cells formed will not exhibit the contemplated characteristics. The unsealed oxalic acid anodized film 3 should be 1 to 20 μm in thickness because if thinner than 1 μm, the film is prone to an insulation breakdown due to a flaw or the like during handling. An increase in the thickness beyond 20 μm does not noticeably contribute to improved insulating properties but merely entails a greater likelihood that the film 3 will crack to result in an insulation breakdown owing to the rise of the temperature of the substrate 1 when the A-Si layer is formed by the CVD process as already stated. Preferably the thickness of the film 3 is smaller within the above-mentioned range, because the cracking can then be prevented more effectively. It is desirable that the thickness be in the range of 1 to 10 μm. Further when the plate 2 is coated with the film 3 by a continuous anodizing process and thereafter cut into substrates 1 of predetermined size, it is preferable to set the upper limit of the thickness of the film 3 to about 10 μm in order to reduce the wear on the cutting die as already mentioned.

Figure 3:
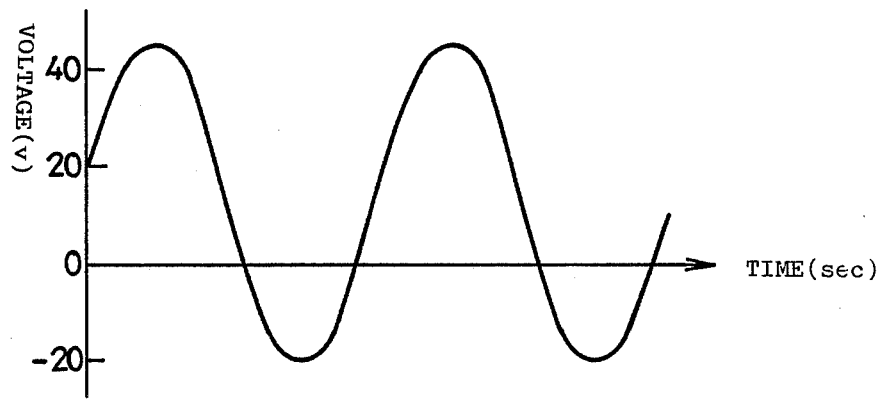
FIG. 3 is a diagram showing an exemplary waveform of electrolytic voltage for forming an oxalic acid anodized film on the surface of an aluminum or aluminum alloy plate in fabricating the substrate of the invention.

The treatment for forming the oxalic acid anodized film 3 is conducted in an electrolyte containing, for example, 2 to 5%, preferably about 3%, of oxalic acid. Examples of useful electrolytic processes are d.c. electrolytic process, pulse current electrolytic process, a.c.-d.c. superposed electrolytic process, etc., among which the a.c.-d.c. superposed electrolytic process is desirable. Especially when the waveform of the electrolytic voltage used has negative portions as illustrated in FIG. 3, this process is effective for giving improved insulating properties to the anodized film. The thickness of the film 3 is controlled by varying the treating time when the oxalic acid concentration of the electrolyte, the electrolytic voltage waveform, etc. are constant or unchanged.

EXAMPLES

Various plates having an aluminum purity of 99% to 99.99% and a surface roughness of 0.2 to 0.8 μm in terms of Rmax., and alloy plates comprising an aluminum base having a purity of 99.5% or 99.7% and 4% magnesium were anodized for a specified period of time in an electrolyte, i.e., 3% aqueous solution of $(COOH)_2$ having a temperature of 35°±2° C. by a.c.-d.c. superposed electrolysis with the application of voltage (60 Hz) of the waveform shown in FIG. 3 to obtain solar cell substrates (specimen Nos. 1 to 6, 8 to 23, 25 to 32, 34 to 40 and 42 to 44) as listed below. Some of the specimens were subjected to a known sealing treatment (specimen Nos. 16, 22, 23, 31 and 39). Further plates having an aluminum purity of 99.5 to 99.99% and a surface roughness of 0.3 μm in Rmax. were anodized for a specified period of time in 5% aqueous solution of $H_2SO_4$ having a temperature of 20°±1° C. and serving as an electrolyte by d.c. electrolysis at a current density of 1.3 A/dm$^2$ to obtain substrates coated with sulfuric acid anodized film (specimen Nos. 7, 24, 33 and 41). The substrates were 100 mm in length, 100 mm in width and 0.5 mm in thickness. The plates providing the substrates contained up to 0.25% of iron and up to 0.20% of silicon.

Subsequently, lower electrodes of 15 mm square were formed on the anodized film of each specimen by the electron beam vacuum evaporation process; 64 electrodes on No. 1-5 and 8-44 specimens, or 16 electrodes on No. 6 and 7 specimens. The resistance between each lower electrode and the aluminum or aluminum alloy plate was measured to check the insulating properties. Each specimen was further continually punched 100,000 times using a punch with a diameter of 10 mm and a die having a hole with a diameter of 10.08 mm. The cutting edge of the punch was thereafter microscopically observed (die abrasion test). After the formation of the lower electrodes, each specimen was heated at 400° C. for 1 hour and then checked for cracks in the film.

Tables 1 and 2 show the details of the specimens and the test results.

TABLE 1

| | Specimen | | Surface roughness Rmax. (μm) | Thickness of anodized film (μm) |
|---|---|---|---|---|
| No. | 1 | 99% Al | 0.3 | 5 (unsealed) |
| | 2 | 99% Al | 0.3 | 10 (unsealed) |
| | 3 | 99% Al | 0.3 | 15 (unsealed) |
| | 4 | 99% Al | 0.5 | 20 (unsealed) |
| Comp.* | 5 | 99% Al | 0.5 | 25 (unsealed) |
| | 6 | 99.5% Al | 0.3 | 2 (unsealed) |
| Comp.* | 7 | 99.5% Al | 0.3 | 2 (unsealed) |
| | 8 | 99.5% Al | 0.3 | 5 (unsealed) |
| | 9 | 99.5% Al | 0.3 | 10 (unsealed) |
| | 10 | 99.5% Al | 0.3 | 12 (unsealed) |
| | 11 | 99.5% Al | 0.5 | 20 (unsealed) |
| Comp.* | 12 | 99.5% Al | 0.5 | 22 (unsealed) |
| | 13 | 99.7% Al | 0.3 | 2 (unsealed) |
| | 14 | 99.7% Al | 0.3 | 5 (unsealed) |
| | 15 | 99.7% Al | 0.3 | 8 (unsealed) |
| Comp.* | 16 | 99.7% Al | 0.3 | 8 (sealed) |
| | 17 | 99.7% Al | 0.2 | 10 (unsealed) |
| | 18 | 99.7% Al | 0.3 | 10 (unsealed) |
| | 19 | 99.7% Al | 0.5 | 10 (unsealed) |
| | 20 | 99.7% Al | 0.6 | 10 (unsealed) |
| | 21 | 99.7% Al | 0.8 | 10 (unsealed) |
| Comp.* | 22 | 99.7% Al | 0.3 | 10 (sealed) |
| Comp.* | 23 | 99.7% Al | 0.5 | 10 (sealed) |
| Comp.* | 24 | 99.7% Al | 0.3 | 10 (unsealed) |
| | 25 | 99.7% Al | 0.3 | 12 (unsealed) |
| No. | 26 | 99.7% Al | 0.3 | 15 (unsealed) |
| | 27 | 99.7% Al | 0.3 | 20 (unsealed) |
| Comp.* | 28 | 99.7% Al | 0.3 | 22 (unsealed) |
| | 29 | 99.9% Al | 0.3 | 2 (unsealed) |
| | 30 | 99.9% Al | 0.3 | 6 (unsealed) |
| Comp.* | 31 | 99.9% Al | 0.3 | 6 (sealed) |
| | 32 | 99.9% Al | 0.3 | 10 (unsealed) |
| Comp.* | 33 | 99.9% Al | 0.3 | 10 (unsealed) |
| | 34 | 99.9% Al | 0.3 | 15 (unsealed) |
| | 35 | 99.9% Al | 0.3 | 20 (unsealed) |
| Comp.* | 36 | 99.9% Al | 0.3 | 25 (unsealed) |
| | 37 | 99.99% Al | 0.3 | 1 (unsealed) |
| | 38 | 99.99% Al | 0.3 | 2.5 (unsealed) |
| Comp.* | 39 | 99.99% Al | 0.3 | 2.5 (sealed) |
| | 40 | 99.99% Al | 0.3 | 5 (unsealed) |
| Comp.* | 41 | 99.99% Al | 0.3 | 5 (unsealed) |
| | 42 | 99.99% Al | 0.3 | 10 (unsealed) |
| | 43 | 99.5% Al + Mg | 0.3 | 2 (unsealed) |
| | 44 | 99.7% Al + Mg | 0.3 | 10 (unsealed) |

*Comparative specimen

TABLE 2

| | Specimen No. | Insulating properties | Die abrasion test | Cracking |
|---|---|---|---|---|
| | 1 | 15/64 below 20 MΩ | A | None |
| | 2 | 10/64 below 20 MΩ | A | None |
| | 3 | All at least 20 MΩ | C | None |
| | 4 | All at least 20 MΩ | C | None |
| Comp.* | 5 | All below 20 MΩ | C | Cracked |
| | 6 | All at least 20 MΩ | A | None |
| Comp.* | 7 | All 10-100Ω | A | None |
| | 8 | 5/64 below 20 MΩ | A | None |
| | 9 | 1/64 below 20 MΩ | A | None |
| | 10 | All at least 20 MΩ | B | None |
| | 11 | All at least 20 MΩ | C | None |
| Comp.* | 12 | All below 20 MΩ | C | Cracked |
| | 13 | 10/64 below 20 MΩ | A | None |
| | 14 | 1/64 below 20 MΩ | A | None |
| | 15 | All at least 20 MΩ | A | None |
| Comp.* | 16 | All below 20 MΩ | A | Cracked |
| | 17 | All at least 20 MΩ | A | None |
| | 18 | All at least 20 MΩ | A | None |
| | 19 | All at least 20 MΩ | A | None |
| | 20 | 5/64 below 20 MΩ | A | None |
| | 21 | 8/64 below 20 MΩ | A | None |
| Comp.* | 22 | All below 20 MΩ | A | Cracked |
| Comp.* | 23 | All below 20 MΩ | A | Cracked |
| Comp.* | 24 | 41/64 below 20 MΩ | A | None |
| | 25 | All at least 20 MΩ | B | None |
| | 26 | All at least 20 MΩ | C | None |
| | 27 | All at least 20 MΩ | C | None |
| Comp.* | 28 | All below 20 MΩ | C | Cracked |
| | 29 | All at least 20 MΩ | A | None |
| | 30 | All at least 20 MΩ | A | None |
| Comp.* | 31 | All below 20 MΩ | A | Cracked |
| | 32 | All at least 20 MΩ | A | None |
| Comp.* | 33 | 40/64 below 20 MΩ | A | None |
| | 34 | All at least 20 MΩ | C | None |
| | 35 | All at least 20 MΩ | C | None |
| Comp.* | 36 | All below 20 MΩ | C | Cracked |
| | 37 | All at least 20 MΩ | A | None |
| | 38 | All at least 20 MΩ | A | None |
| Comp.* | 39 | All below 20 MΩ | A | Cracked |
| | 40 | All at least 20 MΩ | A | None |
| Comp.* | 41 | 42/64 below 20 MΩ | A | Cracked |
| | 42 | All at least 20 MΩ | A | Cracked |
| | 43 | 25/64 below 20 MΩ | A | Cracked |
| | 44 | All at least 20 MΩ | A | Cracked |

Note 1: The results of the die abrasion test in Table 2 were evaluated according to the following criteria:
A ... No wear
B ... Wear only
C ... Wear and dulled edge Note 2: With reference to Table 2, insulating properties for specimen Nos. 1, 2, 8, 9, 20, 21 and 29, a few electrode bearing portions out of 64 portions are below 20 MΩ in resistance. When the number of portions of low resistance out of 64 is as small as these listed numbers, the substrate is actually usable free of trouble.

The present invention may be embodied differently without departing from the spirit and basic features of the invention. Accordingly the embodiments herein disclosed are given for illustrative purposes only and are in no way limitative. It is to be understood that the scope of the invention is defined by the appended claims rather than by the specification and that all alterations and modifications within the definition and scope of the claims are included in the claims.

We claim:

1. A substrate which is suitable for forming thereon amorphous silicon solar cells, the substrate comprising an aluminum or aluminum alloy plate formed on at least one surface thereof with an oxalic acid anodized film in an unsealed state and having a thickness of 1 to 20 μm.

2. A substrate as defined in claim 1 wherein the plate is made of aluminum having a purity of at least 99%.

3. A substrate as defined in claim 1 wherein the plate is made of aluminum having a purity of at least 99.7%.

4. A substrate as defined in claim 1 wherein the plate contains up to 0.25% of iron and up to 0.20% of silicon.

5. A substrate as defined in claim 1 wherein the surface of the plate formed with the anodized film has before the formation of the film a roughness of up to 0.5 μm in terms of the maximum height Rmax. of a sampled portion of the surface.

6. A substrate as defined in claim 1 wherein the surface of the plate formed with the anodized film has before the formation of the film a roughness of up to 0.3 μm in terms of the maximum height Rmax. of a sampled portion of the surface.

7. A substrate which is suitable for forming thereon amorphous silicon solar cells, the substrate comprising a plate of aluminum having a purity of at least 99.7% and an oxalic acid anodized film formed on at least one surface thereof having a roughness of up to 0.5 μm in terms of the maximum height Rmax. of sampled portion, the anodized film being in an unsealed state and having a thickness of 1 to 10 μm.

8. A substrate as defined in claim 7 wherein the plate has an aluminum purity of at least 99.9%, and the anodized film has a thickness of 1 to 5 μm.

9. A substrate as defined in claim 7 or 8 wherein the plate is formed with the oxalic acid anodized film on one surface thereof and clad with a reinforcing plate of aluminum alloy of the AA5000 type on the other surface.

* * * * *